(12) United States Patent
Chi

(10) Patent No.: US 12,745,504 B2
(45) Date of Patent: Sep. 22, 2026

(54) ELECTRONIC DEVICE

(71) Applicant: Innolux Corporation, Miaoli County (TW)

(72) Inventor: Jen-Hai Chi, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 344 days.

(21) Appl. No.: 18/617,556

(22) Filed: Mar. 26, 2024

(65) Prior Publication Data

US 2024/0355985 A1 Oct. 24, 2024

Related U.S. Application Data

(60) Provisional application No. 63/461,328, filed on Apr. 24, 2023.

(30) Foreign Application Priority Data

Jan. 18, 2024 (CN) ........................ 202410075059.0

(51) Int. Cl.

*H10H 29/85* (2025.01)
*H10H 29/49* (2025.01)
*H10W 42/00* (2026.01)
*H10W 70/65* (2026.01)
*H10W 70/68* (2026.01)

(52) U.S. Cl.

CPC .......... *H10H 29/49* (2025.01); *H10H 29/857* (2025.01); *H10W 42/121* (2026.01); *H10W 70/6565* (2026.01); *H10W 70/68* (2026.01)

(58) Field of Classification Search

CPC .... H10H 20/857; H10H 29/857; H10H 29/49; H10W 42/00; H10W 42/121; H10W 70/6565; H10W 70/68

See application file for complete search history.

(56) References Cited

U.S. PATENT DOCUMENTS

2008/0105947 A1* 5/2008 Kuzuhara .......... H10W 20/031 257/E23.141
2010/0270687 A1* 10/2010 Fujihara ............. H10W 20/484 257/E21.59
2021/0400807 A1* 12/2021 Zhou ........................ B05D 5/12
2023/0065711 A1* 3/2023 Tseng .................. H10W 20/063

FOREIGN PATENT DOCUMENTS

CN 101527286 A * 9/2009 ........... H10W 72/00
CN 113451279 9/2021
JP H0714832 B2 * 2/1995
WO WO-2017018212 A1 * 2/2017 .......... H10W 70/098

* cited by examiner

*Primary Examiner* — Lauren R Bell
(74) *Attorney, Agent, or Firm* — JCIPRNET

(57) ABSTRACT

An electronic device including a substrate, a first metal pattern, a first insulating layer, and a second metal pattern is provided. The first metal pattern is disposed on the substrate and has a first thickness. The first insulating layer is disposed on the first metal pattern and has a second thickness. The second metal pattern is disposed on the first insulating layer and has a third thickness. The first thickness ranges from 0.1 μm to 10 μm, and a ratio of the third thickness to the second thickness is greater than 0 and less than or equal to 0.4.

19 Claims, 3 Drawing Sheets

ELECTRONIC DEVICE

CROSS-REFERENCE TO RELATED APPLICATION

This application claims the priority benefit of U.S. provisional application Ser. No. 63/461,328, filed on Apr. 24, 2023 and China application serial no. 202410075059.0, filed on Jan. 18, 2024. The entirety of each of the above-mentioned patent applications is hereby incorporated by reference herein and made a part of this specification.

BACKGROUND

Technical Field

The disclosure relates to an electronic device.

Description of Related Art

With the vigorous development of electronic devices, quality requirements for the electronic devices are becoming higher and higher. On this basis, how to improve a yield rate of the electronic devices is one of main goals of the current development.

SUMMARY

The disclosure provides an electronic device with an improved yield rate.

According to the embodiment of the disclosure, an electronic device includes a substrate, a first metal pattern, a first insulating layer, and a second metal pattern. The first metal pattern is disposed on the substrate and has a first thickness. A first insulating layer is disposed on the first metal pattern and has a second thickness. A second metal pattern is disposed on the first insulating layer and has a third thickness. The first thickness ranges from 0.1 μm to 10 μm, and a ratio of the third thickness to the second thickness is greater than 0 and less than or equal to 0.4.

On the basis, in the disclosure, the ratio of the third thickness to the second thickness is greater than 0 and less than or equal to 0.4, which may enable the first insulating layer to have a relatively large thickness. When the intermediate is formed on the first metal pattern, causing the thickness of the first insulating layer to become smaller due to compression, the possibility of a short circuit between the second metal pattern and the first metal pattern due to contact with each other may be reduced, thereby improving the yield rate of the electronic device provided by the disclosure.

DETAILED DESCRIPTION OF DISCLOSED EMBODIMENTS

Figure 1:
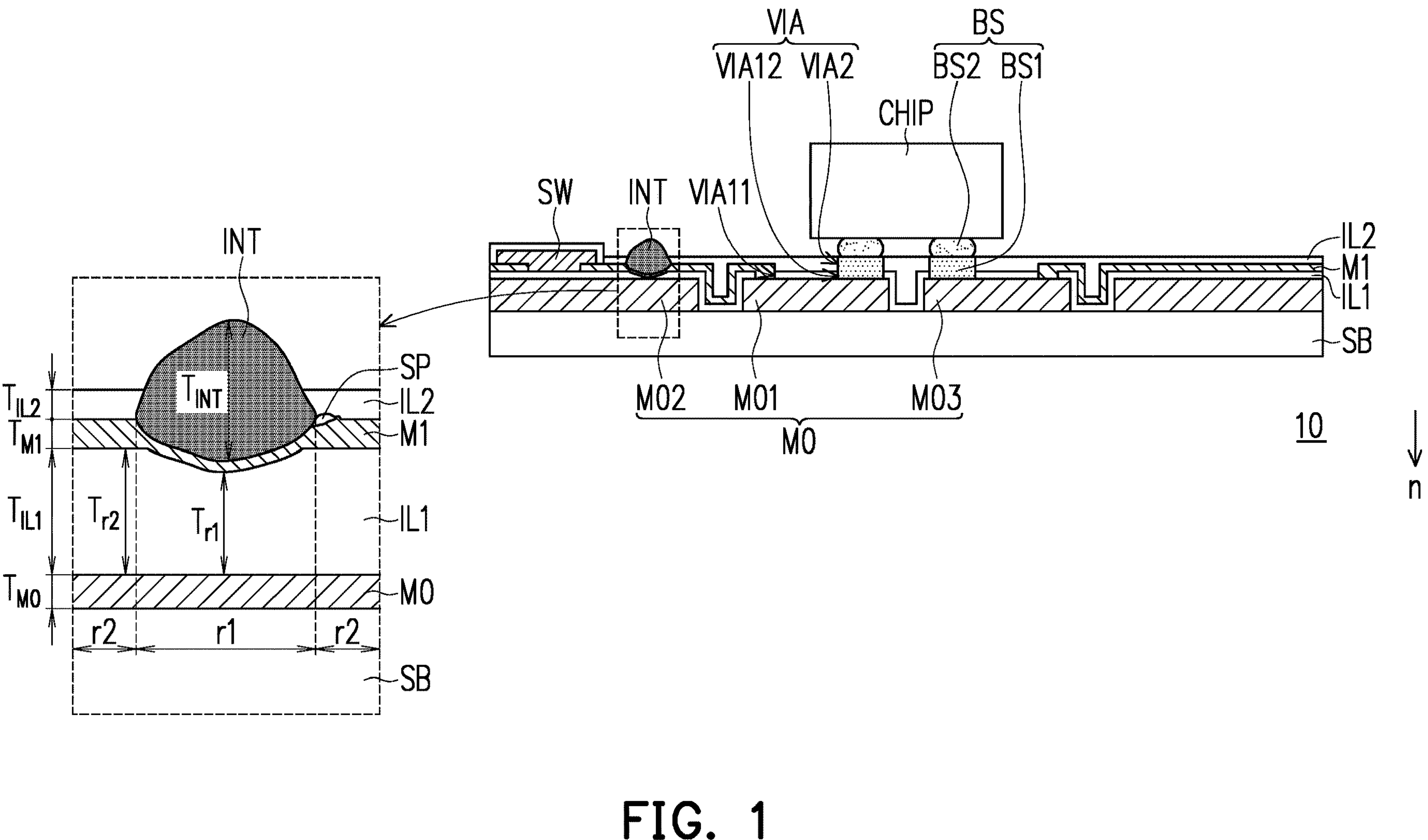
FIG. 1 is a schematic cross-sectional view of an electronic device according to an embodiment of the disclosure.
Figure 2A:
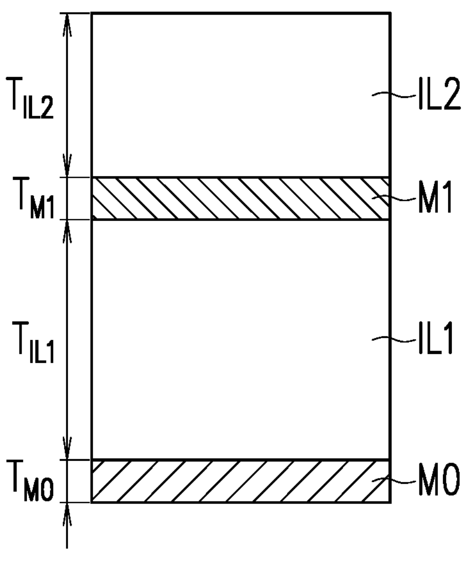
FIG. 2A and FIG. 2B are respectively schematic cross-sectional views of stacked designs of a first metal pattern, a first insulating layer, a second metal pattern, and a second insulating layer of an electronic device according to some embodiments of the disclosure.
Figure 2A:
Figure 2B:
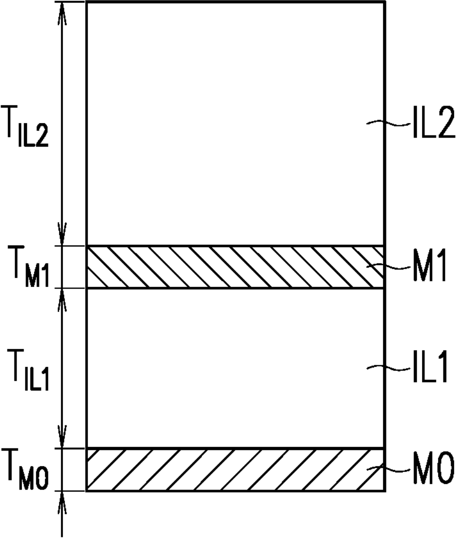
Figure 2B:

The disclosure can be understood by referring to the following detailed description in combination with the accompanying drawings. It should be noted that in order to make it easy for the reader to understand and for the simplicity of the drawings, the multiple drawings in this disclosure only depict a part of the electronic device, and the specific components in the drawings are not drawn according to actual scale. In addition, the number and size of each component in the drawings are only for exemplary purpose, and are not intended to limit the scope of the disclosure.

Throughout the disclosure and the appended claims, certain words are used to refer to specific components. Those skilled in the art should understand that electronic device manufacturers may refer to the same components by different names. The disclosure does not intend to distinguish those components with the same function but different names. In the following description and claims, the terms "including", "containing", and "having" are open-ended terms, so they should be interpreted as "include but not limited to . . . ". Therefore, when the terms "including", "containing", and/or "having" are used in the description of this disclosure, they specify the existence of a corresponding feature, region, step, operation, and/or component, but do not exclude the existence of one or more corresponding features, regions, steps, operations, and/or components.

Direction terms mentioned in this specification, such as such as "up," "down," "front," "back," "left," and "right," merely refer to directions in the accompanying drawings. Therefore, the direction terms used is for illustration, not for limiting this disclosure. In the drawings, each drawing shows the general features of the method, structure, and/or material used in a specific embodiment. However, these drawings should not be construed as defining or limiting the scope or nature of the embodiments. For example, for the sake of clarity, the relative size, thickness, and position of each layer, region, and/or structure may be reduced or enlarged.

When a corresponding member (such as a layer or a region) is described as being "on another member," it may be directly on another member, or there may be other member therebetween. On the other hand, when a member is described as being "directly on another member," no member exists therebetween. In addition, when a member is described as being "on another member," the two have a vertical relationship in the top view direction, and this member may be located above or below the other member, and the vertical relationship depends on the device orientation.

The terms "approximately", "essentially", or "substantially" are generally interpreted as within 10% of a given value or range, or as within 5%, 3%, 2%, 1%, or 0.5% of the value or range.

Ordinal numbers in this specification and the claims such as "first" and "second" are used to modify a component, and do not imply or represent that the (or these) component(s) has (or have) any ordinal number, and do not indicate any order between a component and another component, or an order in a manufacturing method. These ordinal numbers are merely used to clearly distinguish a component having a name with another component having the same name. Different terms may be used in the claims and the specification, so that a first member in the specification may be a second member in the claims.

It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

Electrical connection or coupling described in the disclosure may refer to direct connection or indirect connection. In the case of direct connection, end points of the components on two circuits are directly connected or connected to each other with a conductor segment, and in the case of indirect connection, there are switches, diodes, capacitors, inductors, other suitable components, or a combination of the above components between the end points of the components on the two circuits, but the disclosure is not limited thereto.

In the disclosure, a thickness, a length, and a width may be measured using an optical microscope, and the thickness may be measured using a cross-sectional image in an electronic microscope. However, the disclosure is not limited thereto. In addition, any two values or directions used for comparison may have certain errors. If a first direction is perpendicular to a second direction, an angle between the first direction and the second direction may be between 80 degrees and 100 degrees. If the first direction is parallel to the second direction, the angle between the first direction and the second direction may be between 0 degrees and 10 degrees.

The electronic device in the disclosure may include a light emitting device, an antenna device, a display device, a sensing device, or a tiling device, but the disclosure is not limited thereto. The electronic device may include a bendable or flexible electronic device. The electronic device includes, for example, a liquid crystal layer or a light emitting diode (LED). The electronic device may include an electronic component. The electronic component may include a passive device and an active device, such as a capacitor, a resistor, an inductor, a variable capacitor, a filter, a diode, a transistor, a sensor, a micro electro mechanical system (MEMS) device, and a liquid crystal chip, but the disclosure is not limited thereto. The diode may include a light emitting diode or a photodiode. The light emitting diode may include, for example, an organic light emitting diode (OLED), a mini light emitting diode (mini LED), a micro light emitting diodes (micro LED), a quantum dot light emitting diode (quantum dot LED), fluorescence, phosphor, other suitable materials, or a combination of the above, but the disclosure is not limited thereto. The sensor may include, for example, a capacitive sensor, an optical sensor, an electromagnetic sensor, a fingerprint sensor (FPS), a touch sensor, an antenna, or a pen sensor, but the disclosure is not limited thereto.

Exemplary embodiments of the disclosure are described in the following. The electronic device is used as an antenna device for illustration, and the same reference numerals are used in the drawings and descriptions to indicate the same or similar parts.

FIG. 1 is a schematic cross-sectional view of an electronic device according to an embodiment of the disclosure.

Referring to FIG. 1, an electronic device 10 in this embodiment includes a substrate SB, a metal pattern M0, an insulating layer IL1, a metal pattern M1, an insulating layer IL2, a switching element SW, a bonding structure BS, a chip CHIP, and an intermediate INT. It is worth noting that the electronic device 10 in this embodiment may include, for example, a light emitting device, an antenna device, a display device, a sensing device, or a tiling device, but the disclosure is not limited thereto. In some embodiments, the electronic device 10 is a light emitting device. For example, the electronic device 10 may include an inorganic light emitting diode display (LED display), an organic light emitting diode display device (OLED display), a micro light emitting diode display device (micro LED display), or a mini light emitting diode display (mini LED display), but the disclosure is not limited thereto. In other embodiments, the electronic device 10 is an antenna device. For example, the electronic device 10 may be applied to a communication field, a radar/lidar field, a reconfigurable intelligent surface (RIS) technology, or other suitable fields/technologies, but the disclosure is not limited thereto.

A material of the substrate SB may be, for example, glass, plastic, or a combination thereof. For example, the material of the substrate SB may include quartz, sapphire, silicon (Si), germanium (Ge), silicon carbide (SiC), gallium nitride (GaN), silicon germanium (SiGe), polymethyl methacrylate (PMMA), polycarbonate (PC), polyimide (PI), polyethylene terephthalate (PET), other suitable materials, or a combination of the above materials. The disclosure is not limited thereto.

The metal pattern M0 is, for example, disposed on the substrate SB. In this embodiment, the metal pattern M0 includes a metal pattern M01, a metal pattern M02, and a metal pattern M03. The metal pattern M01 is electrically connected to the chip CHIP and is electrically connected to the switching element SW. In some embodiments, the metal pattern M01 and the metal pattern M03 may serve as pads of the electronic device 10. In some embodiments, the pad (not shown) of the electronic device 10 may be electrically connected to the metal pattern M01 and the metal pattern M03 through other conductive layers or conductive elements, but the disclosure is not limited thereto. In some embodiments, a material of the metal pattern M0 may include a low-impedance material such as copper, titanium, silver, gold, aluminum, tin, nickel, or a combination thereof. However, the material of the metal pattern M0 may also be, for example, other suitable materials or a combination of the above materials, and the disclosure is not limited thereto. In addition, the metal pattern M0 may include a single-layer structure or a multi-layer structure, for example. For example, in some embodiments, the metal pattern M0 may include a single-layer copper layer, but the disclosure is not limited thereto. In other embodiments, the metal pattern M0 may include a stacked structure stacked on each other. For example, the metal pattern M0 may be a multi-layer structure, which may be a titanium nitride layer, a copper layer, and a titanium nitride layer stacked in such order. However, the disclosure is not limited thereto.

In this embodiment, a thickness $T_{M0}$ of the metal pattern M0 is 0.1 μm to 10 μm. For example, the thickness $T_{M0}$ may be 0.5 μm, 1 μm, 2 μm, 4 μm, 6 μm, or 8 μm, but the disclosure is not limited thereto.

The insulating layer IL1 is, for example, disposed on the metal pattern M0. In some embodiments, the insulating layer IL1 partially covers the metal pattern M0. That is, the insulating layer IL1 has a via VIA1 that exposes a portion of the metal pattern M0. In this embodiment, the via VIA1 includes a via VIA11 and a via VIA12. The via VIA11 and the via VIA12 each expose a portion of the metal pattern M01, but the disclosure is not limited thereto. A material of the insulating layer IL1 may be, for example, an inorganic material (e.g., silicon oxide, silicon nitride, silicon oxynitride, or a stacked layer of at least two of the above materials), an organic material (e.g., polyfluoroalkoxy (PFA), photosensitive resin (overcoat or photo spacer), polyimide resin, an ABF material, photosensitive polyimide, solder resist ink, or poly-p-phenylenebenzobisthiazole (PBO)), or a combination of the above, but the disclosure is not limited thereto. In some embodiments, the insulating layer IL1 may include a single-layer structure or a multi-layer structure, but the disclosure is not limited thereto.

The metal pattern M1 is, for example, disposed on the insulating layer IL1. In this embodiment, the metal pattern M1 is electrically connected to the metal pattern M0 through the via VIA11 of the insulating layer IL1. In some embodiments, the metal pattern M1 may include a single-layer structure, but the disclosure is not limited thereto. In some embodiments, the metal pattern M1 may be a multi-layer structure, but the disclosure is not limited thereto. In addition, a material included in the metal pattern M1 may be the same as or similar to the material included in the metal pattern M0. Therefore, the same details will not be repeated in the following. In this embodiment, a ratio of a thickness $T_{M1}$ of the metal pattern M1 to a thickness $T_{IL1}$ of the insulating layer IL1 is greater than 0 and less than or equal to 0.4. On this basis, the thickness $T_{IL1}$ of the insulating layer IL1 may be relatively thick. By increasing the thickness $T_{IL1}$ of the insulating layer IL1, a yield rate of the electronic device provided by an embodiment of the disclosure may be improved, which will be described in detail in the following embodiments.

In some embodiments, the ratio of the thickness $T_{M1}$ of the metal pattern M1 to the thickness $T_{M0}$ of the metal pattern M0 may be between 0.3 and 1, but the disclosure is not limited thereto.

The switching element SW is, for example, disposed on the insulating layer IL1. In this embodiment, the switching element SW is electrically connected to the metal pattern M1, so as to be electrically connected to the metal pattern M01 through the metal pattern M1. The switching element SW may be arranged on the insulating layer IL1 in an array arrangement, a staggered arrangement (e.g., a manner of pentile), or other manners, but the disclosure is not limited thereto. The switching element SW may include a transistor, an integrated circuit, a circuit chip, or other suitable electronic components. The switching element SW may be, for example, a thin film transistor. In detail, the switching element SW may include, for example, a gate (not shown), a source (not shown), a drain (not shown), and a semiconductor layer (not shown). The semiconductor layer is, for example, disposed between the gate, the source, and the drain, but the disclosure is not limited thereto. A material of the semiconductor layer may include, for example, low temperature polysilicon (LTPS), metal oxide, amorphous silicon (a-Si), or a combination thereof, but the disclosure is not limited thereto. For example, the material of the semiconductor layer may include, but is not limited to, amorphous silicon, polycrystalline silicon, germanium, compound semiconductors (e.g., gallium nitride, silicon carbide, gallium arsenide, gallium phosphide, indium phosphide, indium arsenide, and/or indium antimonide), alloy semiconductors (e.g., SiGe alloy, GaAsP alloy, AlInAs alloy, AlGaAs alloy, GaInAs alloy, GaInP alloy, GaInAsP alloy), or a combination of the above. The material of the semiconductor layer may also include, but is not limited to, metal oxide, such as indium gallium zinc oxide (IGZO), indium zinc oxide (IZO), indium gallium zinc tin oxide (IGZTO), organic semiconductor containing polycyclic aromatic hydrocarbon, or a combination of the above. In this embodiment, the material of the semiconductor layer is amorphous silicon, but the disclosure is not limited thereto. The gate at least partially overlaps the semiconductor layer, for example. The source and the drain are, for example, separated from each other, and cover at least a portion of the semiconductor layer and are electrically connected to the semiconductor layer.

The insulating layer IL2 is, for example, disposed on the insulating layer IL1. In this embodiment, the insulating layer IL2 covers the metal pattern M1 and the switching element SW, and exposes a portion of the insulating layer IL1. In detail, the insulating layer IL2 has a via VIA2. The via VIA2 and the via VIA12 of the insulating layer IL1 are communicated to form a via VIA and together expose a portion of the metal pattern M0 (the metal pattern M01). A material of the insulating layer IL2 may be, for example, the inorganic material (e.g., silicon oxide, silicon nitride, silicon oxynitride, or the stacked layer of at least two of the above materials), the organic material (e.g., polyfluoroalkoxy (PFA), photosensitive resin (overcoat or photo spacer), polyimide resin, ABF material, photosensitive polyimide, solder resist ink, or poly-p-phenylenebenzobisthiazole (PBO)), or a combination of the above, but the disclosure is not limited thereto. In some embodiments, the insulating layer IL2 may include a single-layer structure or a multi-layer structure, but the disclosure is not limited thereto.

In this embodiment, a thickness $T_{IL2}$ of the insulating layer IL2 is 2 μm to 5 μm. By enabling the thickness $T_{IL2}$ of the insulating layer IL2 to have the above range, the possibility of poor protection due to the thickness $T_{IL2}$ of the insulating layer IL2 being too thin may be reduced, and the possibility that a yield rate of formation of the subsequent bonding structure BS is low due to the thickness $T_{IL2}$ of the insulating layer IL2 being too thick may be reduced.

The bonding structure BS is, for example, disposed on the insulating layer IL2. In this embodiment, the bonding structure BS is electrically connected to the metal pattern M01 through the via VIA. In this embodiment, the bonding structure BS includes a bump BS1 and a solder BS2. The solder BS2 is disposed on the bump BS1, and at least a portion of the bump BS1 is disposed in the via VIA to be electrically connected to the metal pattern M01. On this basis, the switching element SW may be electrically connected to the bonding structure BS through the metal pattern M01. A material of the bump BS1 may include metal or alloy, for example. For example, the material of the bump BS1 may be an alloy of gold and nickel, which may be formed through an electroless nickel immersion gold (ENIG) process, but the disclosure is not limited thereto. A material of the solder BS2 includes, for example, solder paste, which is formed by, for example, a stencil printing process.

The chip CHIP is, for example, disposed on the bonding structure BS. In some embodiments, the chip CHIP may include a light emitting element. In detail, the chip CHIP may include, for example, an inorganic light emitting diode, an organic light emitting diode, a micro light emitting diode, or a mini light emitting diode. In other embodiments, the chip CHIP may include a communication component. In detail, the chip CHIP may include, for example, a varactor, a variable capacitor, a radio frequency radiation element, a variable resistor, a phase shifter, an amplifier, an antenna, a biometric sensor, a graphene sensor, other suitable components, or a combination thereof. However, the disclosure is not limited thereto.

The intermediate INT may be, for example, located on the metal pattern M1. In this embodiment, the intermediate INT may be located between the insulating layer IL1 and the insulating layer IL2. The intermediate INT may, for example, be a conductive material or a non-conductive material. In some embodiments, a thickness TINT of the intermediate INT may be 5 μm to 60 μm. In this embodiment, the intermediate INT penetrates the insulating layer IL2, and a portion of the intermediate INT may be in contact with the metal pattern M1. However, the disclosure is not limited thereto. In some embodiments, there may be a buffer space SP between the intermediate INT and the metal pattern M1. The buffer space SP includes an air gap. Through formation of the buffer space SP, the possibility that the metal pattern M1 is broken by compression of the intermediate INT, resulting in an open circuit may be reduced.

Based on the above, a distance (i.e., the thickness of the insulating layer IL1) between the metal pattern M1 and the metal pattern M0 in a top-view direction n of the electronic device 10 will change due to formation of the intermediate INT. In this embodiment, the insulating layer IL1 has a first area r1 and a second area r2. The second area r2 is disposed adjacent to the first area r1, and the first area r1 of the insulating layer IL1 is defined as overlapping an area where the intermediate INT is projected on the insulating layer IL1. The insulating layer IL1 has a thickness $T_{r1}$ in the first area r1, and the insulating layer IL1 has a thickness $T_{r2}$ in the second area r2. The thickness $T_{r1}$ will be different from the thickness $T_{r2}$ due to the formation of the intermediate INT. In this embodiment, the thickness $T_{r1}$ of the insulating layer IL1 in the first area r1 is greater than 0 and less than the thickness $T_{r2}$ of the insulating layer IL1 in the second area r2. In some embodiments, a ratio of the thickness $T_{r1}$ to the thickness $T_{r2}$ may be between 0.1 to 0.95 (0.1≤the ratio≤0.95). In other embodiments, the ratio of the thickness $T_{r1}$ to the thickness $T_{r2}$ may be between 0.25 to 0.9 (0.25≤the ratio≤0.9). For example, the ratio may be 0.3, 0.4, 0.5, 0.6, 0.7, 0.8. By enabling the ratio of the thickness $T_{r1}$ to the thickness $T_{r2}$ to have the above range, the possibility of an increase in parasitic capacitance and/or an increase in RC loading due to the close distance between the metal pattern M1 and the metal pattern M0 may be reduced, thereby improving a yield rate of the electronic device 10.

Therefore, the formation of the intermediate INT shortens the distance between the metal pattern M1 and the metal pattern M0. In order to reduce the possibility of a short circuit between the metal pattern M1 and the metal pattern M0, the thickness $T_{M1}$ of the metal pattern M1 and the thickness $T_{IL1}$ of the insulating layer IL1 provided in this embodiment have the following relationship. The ratio of the thickness $T_{M1}$ of the metal pattern M1 to the thickness $T_{IL1}$ of the insulating layer IL1 is greater than 0 and less than or equal to 0.4.

In other words, by increasing the thickness $T_{IL1}$ of the insulating layer IL1, when the thickness $T_{r1}$ of the insulating layer IL1 in the first area r1 becomes smaller due to the formation of the intermediate INT, the possibility of the short circuit between the metal pattern M1 and the metal pattern M0 due to contact with each other may be reduced.

Figure 3:
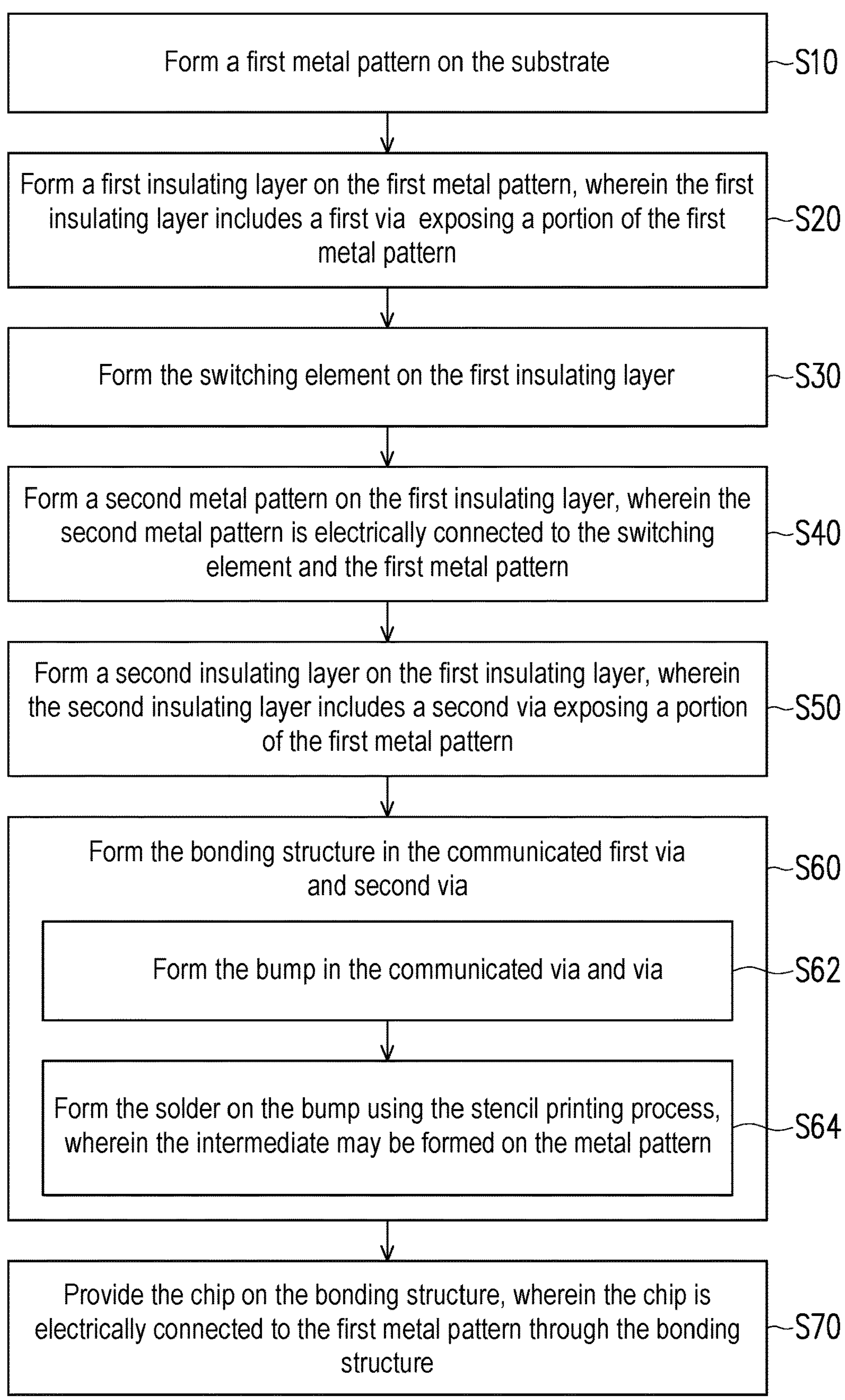
FIG. 3 is a flow chart of a manufacturing method of an electronic device according to an embodiment of the disclosure.

FIG. 3 is a flow chart of a manufacturing method of an electronic device according to an embodiment of the disclosure, which may be, for example, a partial manufacturing process of the electronic device 10.

Referring to FIG. 3, in step S10, a first metal pattern (hereinafter referred to as the metal pattern M0) is formed on the substrate SB.

The aforementioned embodiment may be referred for the material included in the substrate SB. Therefore, the same details will not be repeated in the following. The metal pattern M0 may be formed on the substrate SB by, for example, physical vapor deposition (PVD), chemical vapor deposition (CVD), electroplating, chemical plating, diffusion, photolithography and patterning, laser, coating, or other suitable processes, and the disclosure is not limited thereto. The aforementioned embodiment may be referred for the material included in the metal pattern M0 and a structure thereof. Therefore, the same details will not be repeated in the following.

In step S20, a first insulating layer (hereinafter referred to as the insulating layer IL1) is formed on the first metal pattern (hereinafter referred to as the metal pattern M0). The first insulating layer includes a first via (hereinafter referred to as the via VIA1) exposing a portion of the first metal pattern.

A method of forming the insulating layer IL1 may be, for example, to first form an insulating material layer (not shown) on the metal pattern M0 by chemical vapor deposition or other suitable processes, and then perform a patterning process on the insulating material layer to form the insulating layer IL1 having the via VIA11. The via VIA11 exposes a portion of the metal pattern M0, but the disclosure is not limited thereto. The aforementioned embodiment may be referred for the material included in the insulating layer IL1. Therefore, the same details will not be repeated in the following.

In step S30, the switching element SW is formed on the first insulating layer (hereinafter referred to as the insulating layer IL1), which may be formed by performing the following process, but the disclosure is not limited thereto.

First, the gate (not shown) is formed on the insulating layer IL1. The gate may be formed by performing the following steps, for example. First, a gate material layer (not shown) is formed on the insulating layer IL1 using physical vapor deposition, chemical vapor deposition, or other suitable processes. Then, the patterning process is performed on the gate material layer to form the gate. The aforementioned embodiment may be referred for a material included in the gate and use thereof. Therefore, the same details will not be repeated in the following.

Next, a gate insulating layer (not shown) is formed on the insulating layer IL1. The gate insulating layer covers the gate, for example. The gate insulating layer may be, for example, be formed by using chemical vapor deposition or other suitable processes, but the disclosure is not limited thereto.

Afterwards, the semiconductor layer (not shown) is formed on the gate insulating layer. The semiconductor layer at least partially overlaps the gate, for example. The semiconductor layer may be formed by, for example, first forming a semiconductor material layer (not shown) on the gate insulating layer using chemical vapor deposition or other suitable processes, and then performing the patterning process on the semiconductor material layer to form the semiconductor layer. However, the disclosure is not limited thereto. The aforementioned embodiment may be referred for the material included in the semiconductor layer. Therefore, the same details will not be repeated in the following.

Then, the source (not shown) and the drain (not shown) are formed on the gate insulating layer. The source and the drain are, for example, separated from each other and are electrically connected to the semiconductor layer respectively. The source and the drain may be formed by performing the following steps, for example. First, a source material layer and a drain material layer (not shown) are formed on the gate insulating layer using physical vapor deposition, chemical vapor deposition, or other suitable processes. Then, the patterning process is performed on the source material layer and the drain material layer to form the source and the drain respectively. However, the disclosure is not limited thereto. The aforementioned embodiment may be referred for materials included in the source and the drain and use thereof. Therefore, the same details will not be repeated in the following.

At this point, the switching element SW is formed on the insulating layer IL1. the switching element SW is a bottom gate thin film transistor, but the disclosure is not limited thereto.

In step S40, a second metal pattern (hereinafter referred to as the metal pattern M1) is formed on the first insulating layer (hereinafter referred to as the insulating layer IL1). The second metal pattern is electrically connected to the switching element and the first metal pattern (hereinafter referred to as the metal pattern M0).

A method of forming the metal pattern M1 may be the same as or similar to the method of forming the metal pattern M0. Therefore, the same details will not be repeated in the following. The metal pattern M1 is electrically connected to the metal pattern M0 through, for example, the via VIA11 of the insulating layer IL1, and is electrically connected to the switching element SW, for example.

In other embodiments, the metal pattern M1 may belong to the same layer as the gate or the source and the drain of the switching element SW. That is, the metal pattern M1 may be formed together with the gate or the source and the drain of the switching element SW in step S30, for example, but the disclosure is not limited thereto.

In step S50, a second insulating layer (hereinafter referred to as the insulating layer IL2) is formed on the first insulating layer (hereinafter referred to as the insulating layer IL1). The second insulating layer includes a second via (hereinafter referred to as the via VIA2) exposing a portion of the first metal pattern (hereinafter referred to as the metal pattern M0).

The insulating layer IL2 may be formed, for example, by first forming the insulating material layer (not shown) on the insulating layer IL1 using chemical vapor deposition or other suitable processes, and then performing the patterning process on the insulating material layer to form the insulating layer IL2 having the via VIA2. It is worth noting that in step S50, a portion of the insulating layer IL1 may be removed together to form the via VIA12 in the insulating layer IL1. The via VIA2 and the via VIA12 are communicated to form the via VIA to expose a portion of the metal pattern M0 together, but the disclosure is not limited thereto. The aforementioned embodiment may be referred for the material included in the insulating layer IL2. Therefore, the same details will not be repeated in the following.

In step S60, the bonding structure BS is formed in the communicated first via (hereinafter referred to as the via VIA12) and second via (hereinafter referred to as the via VIA2), which may be formed by performing the following process, but the disclosure is not limited thereto.

First, step S62 is performed. The bump BS1 is formed in the communicated via VIA12 and via VIA2. The bump BS1 is formed by, for example, performing the electroless nickel immersion gold process. The aforementioned embodiment may be referred for the material of the bump BS1 and composition thereof. Therefore, the same details will not be repeated in the following.

Next, step S64 is performed. The solder BS2 is formed on the bump BS1 using the stencil printing process. The intermediate INT may be formed on the metal pattern M1. The stencil printing process includes, for example, the following steps: (1) aligning a steel plate with an opening with the communicated via VIA12 and via VIA2; (2) filling the solder paste into the opening of the steel plate using a scraper; 3) removing the steel plate after printing the solder paste.

During the stencil printing process, the intermediate INT is formed. The intermediate INT may be located on the metal pattern M1, but the disclosure is not limited thereto.

After step S62 and step S64 are performed, the bonding structure BS is formed. The aforementioned embodiment may be referred for the material of the bonding structure BS and composition thereof. Therefore, the same details will not be repeated in the following.

In S70, the chip CHIP is provided on the bonding structure BS. The chip CHIP is electrically connected to the first metal pattern (hereinafter referred to as the metal pattern M0) through the bonding structure BS. The chip CHIP may be bonded to the bonding structure BS, for example, by performing a suitable process (e.g., pick-and-place technology), but the disclosure is not limited thereto. The aforementioned embodiment may be referred for types of the chip CHIP and functions thereof. Therefore, the same details will not be repeated in the following.

Based on the above, the ratio of the thickness $T_{M1}$ of the metal pattern M1 and the thickness $T_{IL1}$ of the insulating layer IL1 in the electronic device provided by an embodiment of the disclosure is greater than 0 and less than or equal to 0.4. By increasing the thickness $T_{IL1}$ of the insulating layer IL1, when the thickness $T_{r1}$ of the insulating layer IL1 in the first area r1 becomes smaller due to the formation of the intermediate INT, the possibility of the short circuit between the metal pattern M1 and the metal pattern M0 due to contact with each other may be reduced. As a result, the yield rate of the electronic device provided by an embodiment of the disclosure may be improved.

Furthermore, in the manufacturing method of the electronic device provided by an embodiment of the disclosure, subsequent processes may be continued while the intermediate is formed on the metal pattern M1, which may improve the process efficiency of the manufacturing method of the electronic device provided by an embodiment of the disclosure.

What is claimed is:

1. An electronic device, comprising:

a substrate;

a first metal pattern disposed on the substrate and having a first thickness;

a first insulating layer disposed on the first metal pattern and having a second thickness;

a second metal pattern disposed on the first insulating layer and having a third thickness; and an intermediate disposed on the second metal pattern, wherein the intermediate compresses the second metal pattern and the first insulating layer, wherein the first thickness ranges from 0.1 μm to 10 μm, and a ratio of the third thickness to the second thickness is greater than 0 and less than or equal to 0.4.

2. The electronic device according to claim 1, further comprising a switching element, wherein the switching element is electrically connected to the second metal pattern.

3. The electronic device according to claim 2, wherein the switching element is electrically connected to the first metal pattern through the second metal pattern.

4. The electronic device according to claim 2, wherein the switching element is electrically connected to a third metal pattern through the second metal pattern.

5. The electronic device according to claim 4, wherein the first metal pattern and the third metal pattern belong to a same layer.

6. The electronic device according to claim 1, further comprising a second insulating layer, wherein the intermediate is located between the first insulating layer and the second insulating layer.

7. The electronic device according to claim 6, further comprising a chip and a bonding structure, wherein the chip and the bonding structure are disposed on the second insulating layer.

8. The electronic device according to claim 1, wherein there is a buffer space between the intermediate and the second metal pattern.

9. The electronic device according to claim 1, wherein the first insulating layer has a first area and a second area, and the second area is disposed adjacent to the first area, wherein the first area includes an area where the intermediate is compresses the first insulating layer, the first insulating layer has the second thickness in the second area, and a thickness of the first insulating layer in the first area is greater than 0 and less than the second thickness.

10. The electronic device according to claim 9, wherein a ratio of the thickness of the first insulating layer in the first area to the second thickness is between 0.1 and 0.95.

11. The electronic device according to claim 10, wherein the ratio of the thickness of the first insulating layer in the first area to the second thickness is between 0.25 and 0.9.

12. The electronic device according to claim 1, wherein the first thickness ranges from 0.5 μm to 8 μm.

13. The electronic device according to claim 1, wherein a ratio of the third thickness to the first thickness is between 0.3 and 1.

14. The electronic device according to claim 7, wherein a thickness of a second insulating layer is 2 μm to 5 μm.

15. The electronic device according to claim 7, wherein the chip is electrically connected to the first metal pattern through the bonding structure.

16. The electronic device according to claim 7, wherein the bonding structure comprises a bump and a solder, and the solder is disposed on the bump.

17. The electronic device according to claim 16, wherein the bump is formed by an electroless nickel immersion gold process.

18. The electronic device according to claim 16, wherein the solder is formed by a stencil printing process.

19. The electronic device according to claim 18, wherein a material of the solder comprises solder paste.

* * * * *